United States Patent [19]

Weng et al.

[11] 4,397,022

[45] Aug. 2, 1983

[54] WEIGHTED ERASURE CODEC FOR THE (24, 12) EXTENDED GOLAY CODE

[76] Inventors: Ming-I. Weng; Lin-Nan Lee, both of 18515 Eagles Roost Dr., Germantown, Md. 20767

[21] Appl. No.: 230,136

[22] Filed: Jan. 30, 1981

[51] Int. Cl.³ .............................................. G06F 11/10
[52] U.S. Cl. ........................................ 371/37; 371/5; 371/41
[58] Field of Search ....................... 371/37, 39, 40, 41, 371/5

[56] References Cited

U.S. PATENT DOCUMENTS

| | | |
|---|---|---|
| 3,078,443 | 2/1963 | Rose ........................................ 371/41 |
| 4,117,458 | 9/1978 | Burghard et al. ...................... 371/37 |
| 4,168,486 | 9/1979 | Leygory .................................. 371/37 |

OTHER PUBLICATIONS

Mears, Jr., High-Speed Error Correcting Encoder/Decoder, IBM Technical Disclosure Bulletin, vol. 23, No. 4, Oct. 1980, pp. 2135-2136.
Peterson & Weldon, Error Correcting Codes, The MIT Press, 1972, pp. 120-121, 210.
Lin, An Introduction to Error-Correcting Codes, Prentice-Hall, 1970, pp. 101-109.

*Primary Examiner*—Charles E. Atkinson
*Attorney, Agent, or Firm*—Sughrue, Mion, Zinn, Macpeak, and Seas

[57] ABSTRACT

A codec consists of an encoder and decoder. The encoder provides 12 information bits, 11 parity bits generated according to the polynomial for the (23, 12) Golay code, and an overall parity bit to a transmitter at selected transmit times to form a 24-bit block of data. The decoder is separated into two independent list decoders, a comparator, and common clock generator and output buffers. Each list decoder is divided into a syndrome generator and an overall parity check generator, a syndrome error pattern table, an input buffer, error correction logic, and four-error detection logic. The error pattern table includes a pair of read only memories storing the most likely 12-bit error patterns at each ROM address corresponding to each syndrome. An additional 4-bit output is used to indicate the number of errors in the associated error pattern. The comparator compares the number of errors detected in the two independent decoders and chooses the decoder having the fewer number of errors to provide the corrected data.

16 Claims, 9 Drawing Figures

FIG. 8

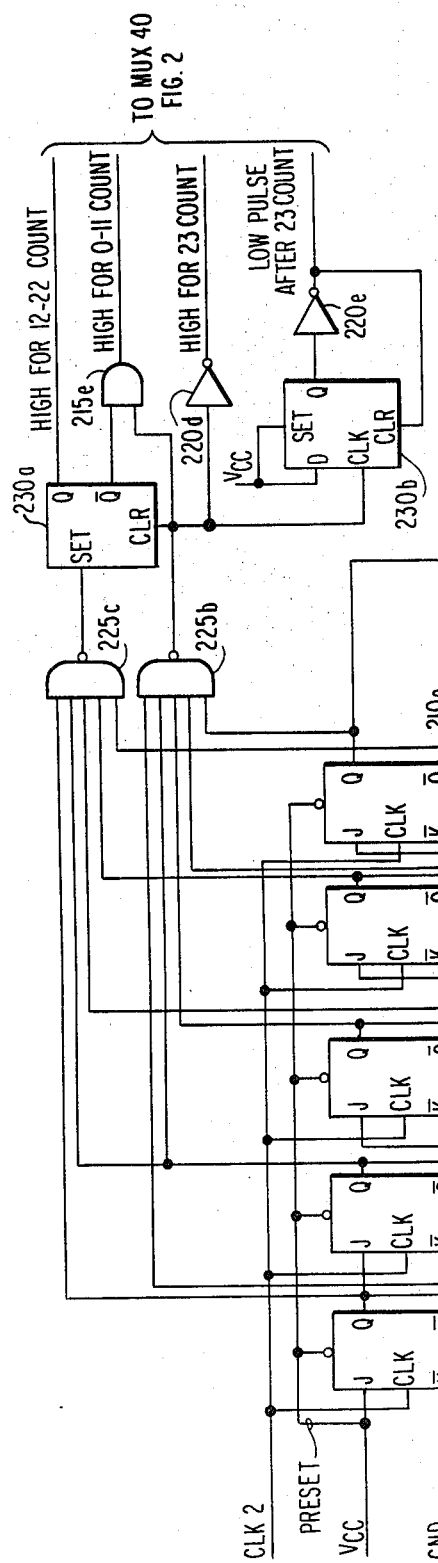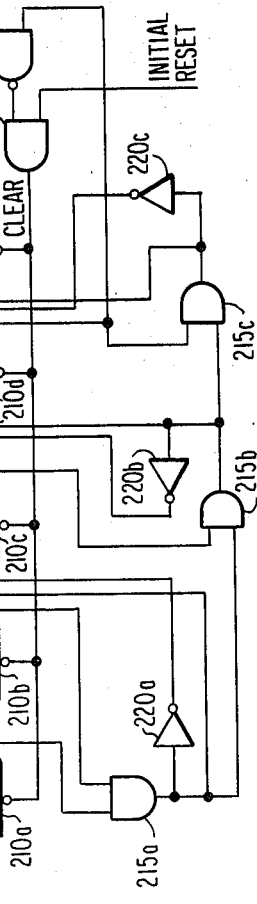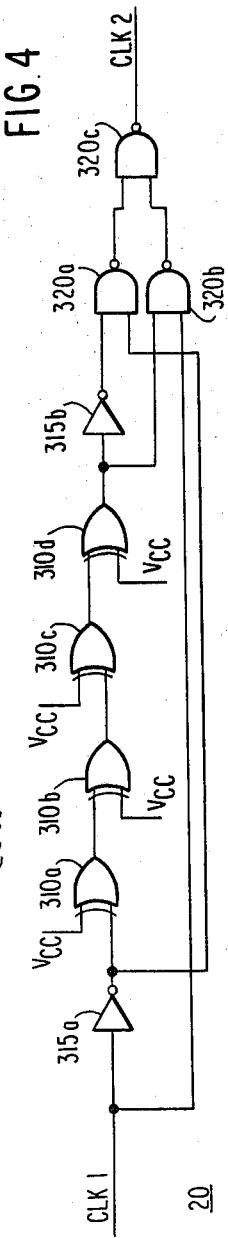
FIG. 3
FIG. 4

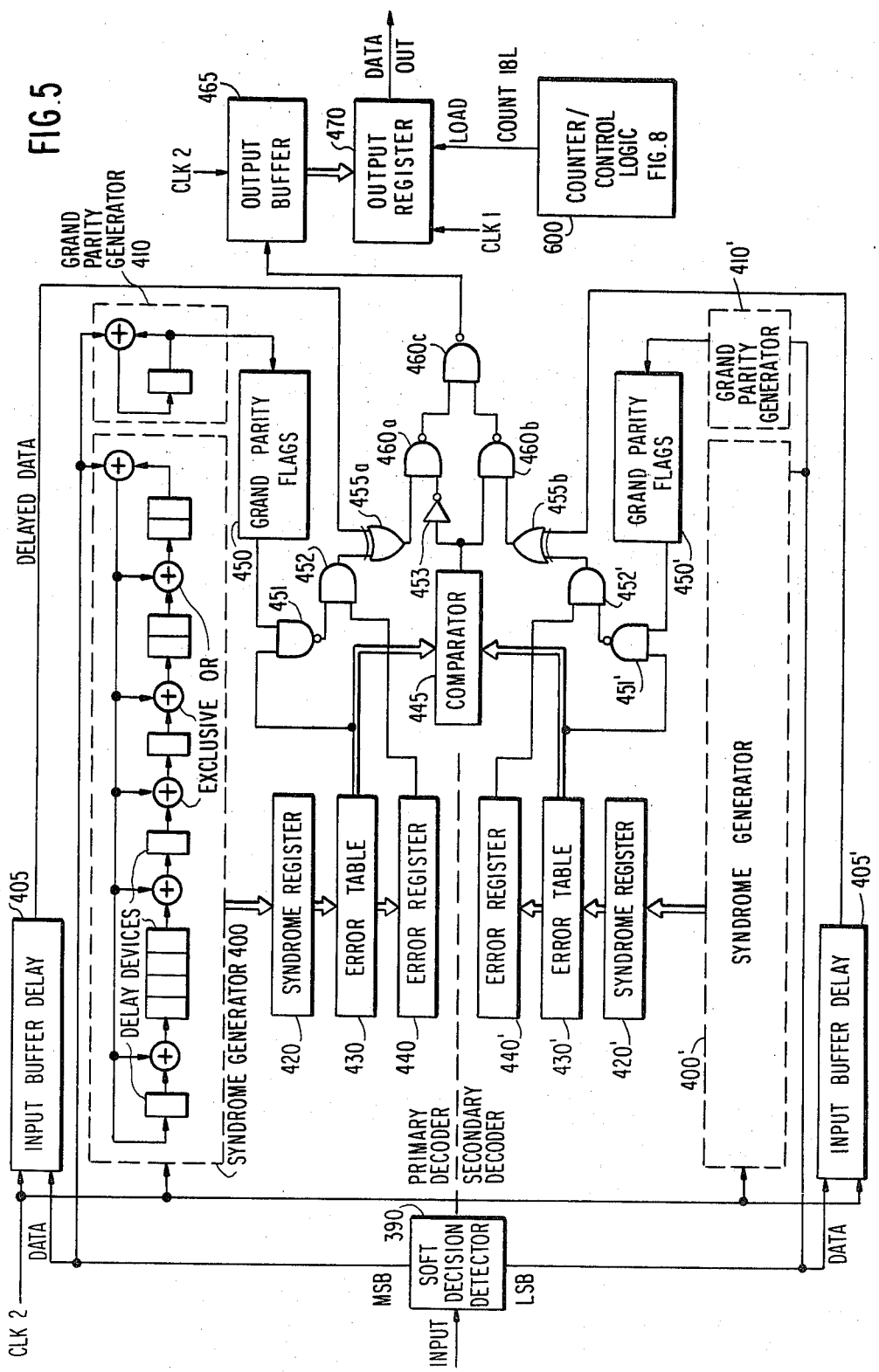

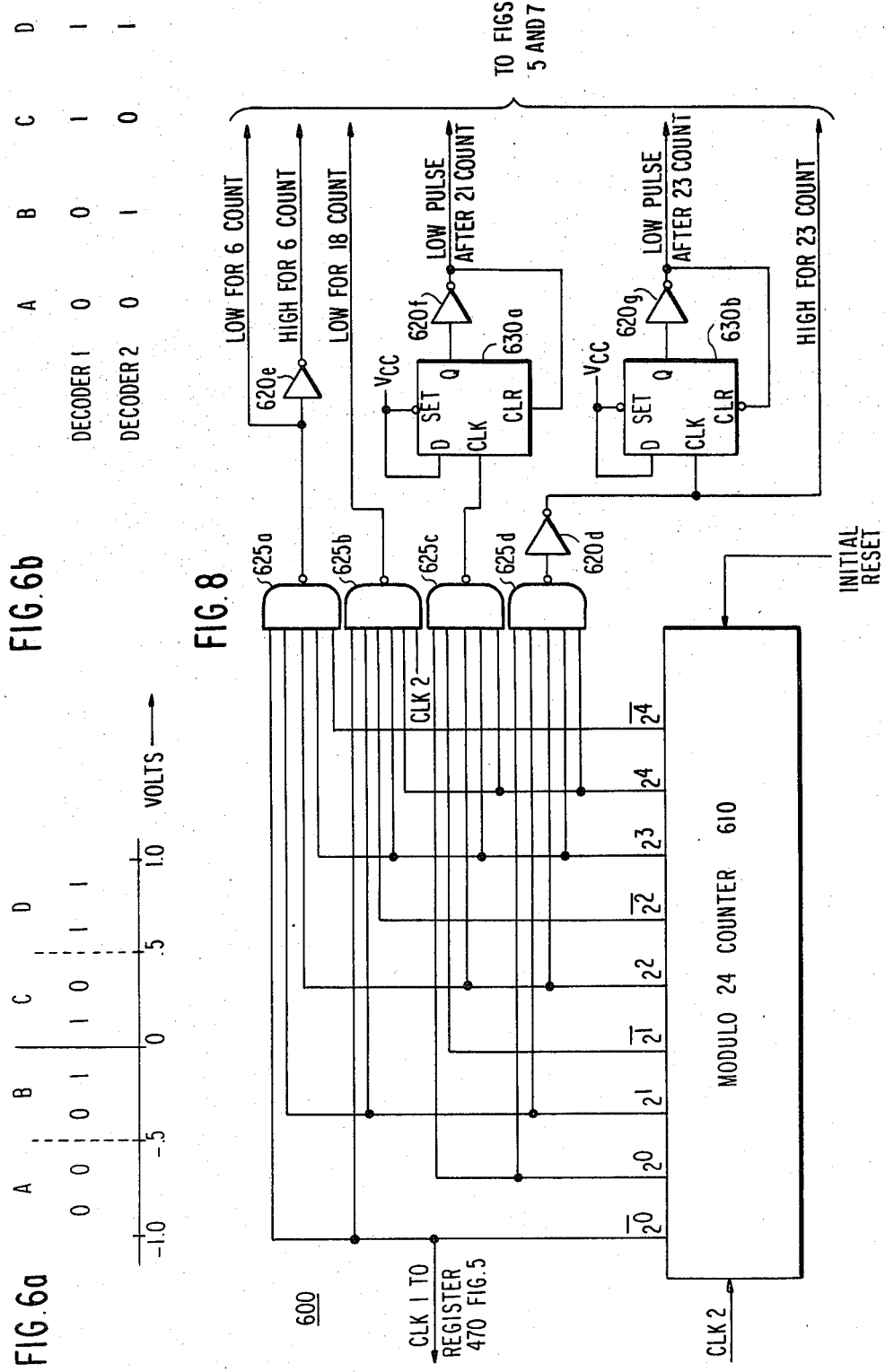

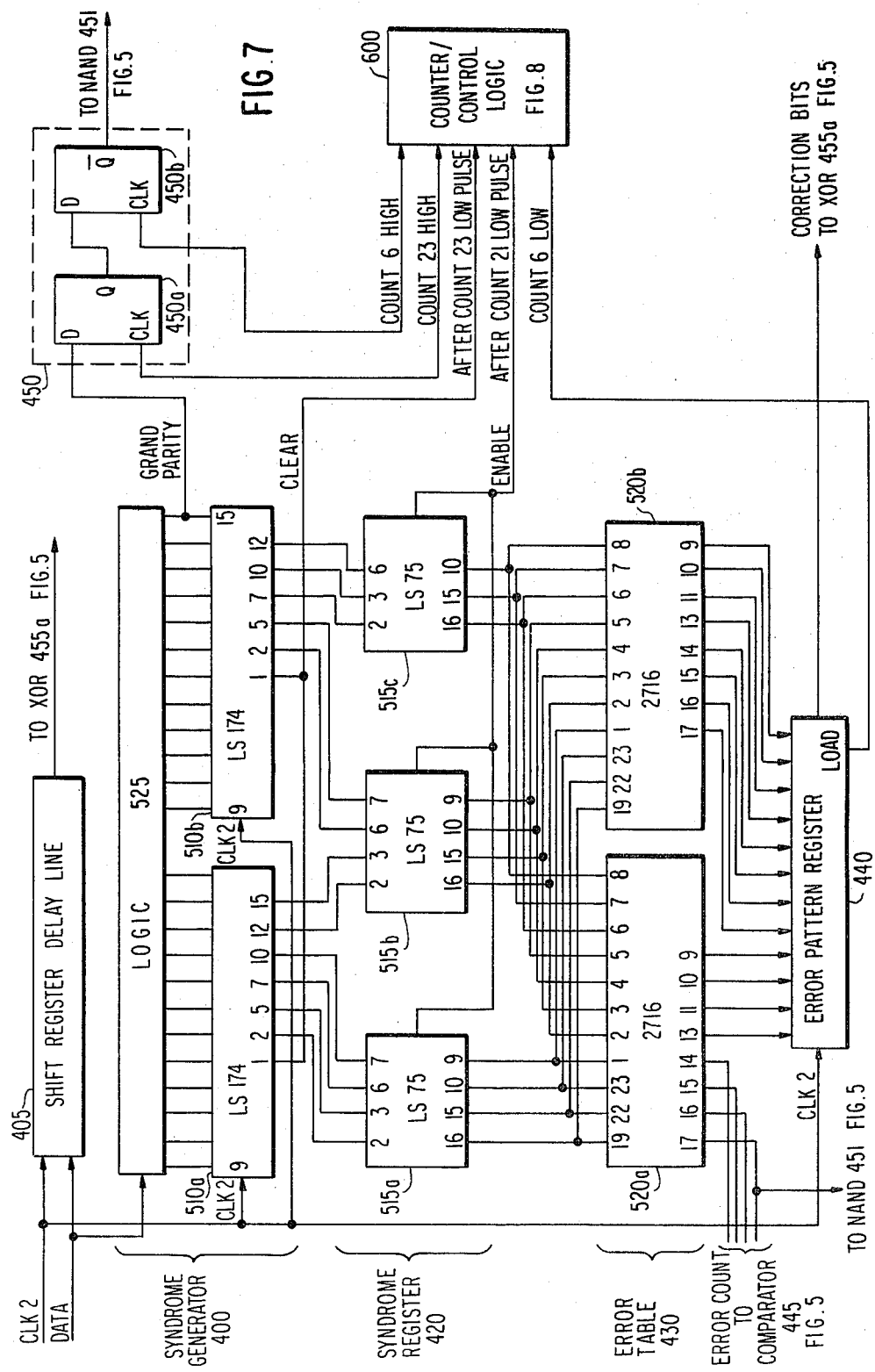

WEIGHTED ERASURE CODEC FOR THE (24, 12) EXTENDED GOLAY CODE

BACKGROUND OF THE INVENTION

The present invention is directed to a forward error correction technique employing the (24, 12) extended Golay code.

A number of decoding methods for the (24, 12) Golay code are known. For hard decision coding, Kasami, T. "A Decoding Procedure for Multiple-Error-Correcting Cyclic Codes," *IEEE Transactions on Information Theory*, IT-10, pp. 134–139, April, 1964, and Weldon, E. J., "A Comparison of an Interleaved Golay Code and a Three-Dimensional Product Code," Final Report, US-NELC, Contract N0095368M 5345, August 1968, proposed two classical techniques which require a large number of logical connections or iterations. (See Lin, S., *An Introduction to Error-Correcting Codes*, Prentice-Hall, Inc., Englewood Cliffs, NY, 1970). For soft decision decoding, Chase, D., "A Class of Algorithms for Decoding Block Codes with Channel Measurement Information," *IEEE Transactions on Information Theory*, IT-18, pp. 170–182, 1972, and Weldon, E. J., "Decoding Binary Block Codes on Q-ary Output Channels," *IEEE Transactions on Information Theory*, IT-17, pp. 713–718, 1971, proposed separate algorithms based on the above-mentioned hard decision algorithms to thereby provide a considerable coding gain.

As solid state technology improves, the list decoding technique for hard decision decoding of block codes becomes more effective compared to the implementation of the classical algebraic algorithms. List decoders with read only memories (RAM) have been implemented for hard decision decoding of BCH codes, as noted in "Final Study Report for IS-838 High-Speed Forward Error Correction Codec," Prepared for INTELSAT, KDD Co, Ltd., Tokyo, Japan, January 1978.

However, the Kasami decoder requires a complicated logic structure, while the Weldon decoder requires a great number of iterations. Further, the Chase method for soft decision decoding requires many trial and error searches. Thus, weighted erasure decoders based on the Kasami decoders are extremely complicated, while the iterative decoding algorithms are generally unsuitable for high-speed operation.

SUMMARY OF THE PRESENT INVENTION

It is an object of the present invention to provide a weighted erasure codec for the (24, 12) extended Golay code which avoids the difficulties associated with the abovementioned prior art techniques, whereby the weighted erasure codec in accordance with the present invention is simple to implement and suitable for high-speed digital communication operations.

The weighted erasure codec in accordance with the present invention consists of an encoder and a weighted erasure decoder. The encoder includes a linear feedback shift register, an overall parity check generator, a clock doubler, a 5-bit counter and associated switching logic, and two 12-bit input buffers. The linear feedback shift register is used for parity check generation, and is wired according to the generator polynomial for the (23, 12) Golay code. The clock doubler generates a clock having a frequency twice that of the input data rate. The counter and associated switching logic is used to provide as an output of the encoder the contents of (i) the input buffer when the counter counts from 0 to 11, (ii) the contents of the linear feedback shift register when the counter counts from 12 to 22, and (iii) the contents of the overall parity check generator when the counter counts to 23. The counter returns to zero after 23.

The weighted erasure decoder in accordance with the present invention is separated into two independent list decoders, a comparator, and common clock generator and output buffers. Each list decoder is divided into a syndrome generator, an overall parity check generator, a syndrome error pattern table, an input buffer, error correction logic, and four error detection logic. The syndrome generator is an 11-bit linear feedback shift register wired according to the generator polynomial in a manner substantially identical to the linear feedback shift register used in the encoder. The overall parity check generator computes the parity of the entire received block. The syndrome-error pattern table consists of two 2K×8 programmable ROMs. The 12-bit pattern of the most likely error pattern is stored at each ROM address corresponding to each syndrome. An additional 4-bit output is used to provide the number of errors in the most likely error pattern. The error correction logic is an exclusive OR gate which operates on the contents of the input buffer and the output of the ROMs on a bit-by-bit basis. The error detecting logic simply outputs the number of errors as indicated by the ROMs, and the comparator compares the number of errors detected in the two independent list decoders and chooses the decoder having the fewer number of errors to provide the corrected data, the primary decoder being chosen in case of a tie.

BRIEF DESCRIPTION OF THE DRAWINGS

FIG. 3 is a schematic illustration of the counter/control logic used in the encoder illustrated in FIG. 2;

FIG. 4 is a schematic illustration of the clock doubler utilized in the encoder of FIG. 2;

FIG. 5 is a block and logic diagram of the decoder in accordance with the present invention;

FIG. 6 is an illustration of the data applied to each of the two independent list decoders shown in FIG. 5;

FIG. 7 is a schematic illustration of one of the two independent list decoders in accordance with the present invention; and FIG. 8 is a schematic illustration of the counter/control logic employed in each of the list decoders illustrated in FIG. 7.

DESCRIPTION OF THE PREFERRED EMBODIMENTS

Figure 1:
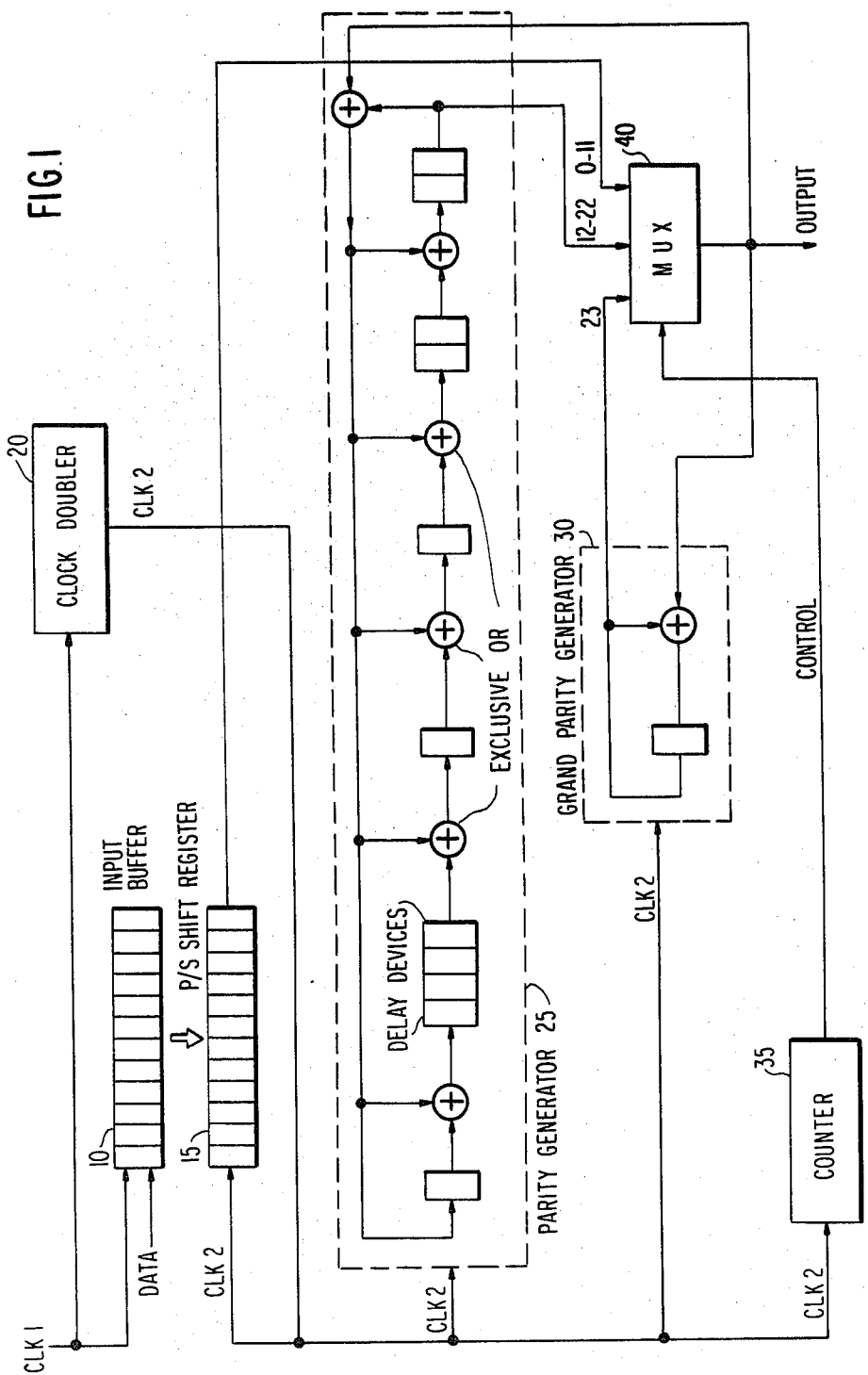
FIG. 1 is a block diagram of the encoder in accordance with the present invention.

FIG. 1 illustrates the encoder in accordance with the present invention. By way of background, the (24, 12) Golay code is a "rate $\frac{1}{2}$" Golay code, meaning that the actual data transmitted is provided at one-half the total transmission rate, the total rate including both information and parity bits. In other words, for every 24-bits transmitted, 12, or $\frac{1}{2}$ of the transmitted bits, contain information, the other 12 containing parity information used in the error correcting process.

The information bits are applied to input buffer 10 at a first rate CLK 1 to eventually provide 12 parallel information bits to parallel-to-serial shift register 15. CLK 1 is applied to clock doubler 20 which in turn provides CLK 2, at a rate twice that of CLK 1. The information bits are thus shifted out of P/S shift register 15 at the CLK 2 rate, and are applied to multiplexer 40. CLK 2 is also applied to modulo-24 counter 35 which provides control signals to multiplexer 40, such that the information bits applied to the multiplexer are provided as an output during the first 12 clock periods, 0–11.

The output of the multiplexer is applied to the parity generator 25, which embodies the linear feedback shift register, generator 25 also receiving clock signal CLK 2. The boxes shown within parity generator 25 represent delay devices, which operate to delay the signal appearing at the input from being provided at the output by one clock period (CLK 2). The circles illustrated within parity generator 25 represent the exclusive OR operation. As shown, the parity generator 25 will produce the generator polynomial for the (23, 12) Golay code $$g(x) = 1 + x + x^5 + x^6 + x^7 + x^9 + x^{11}.$$

The output of the parity generator 25 is provided at the output of the multiplexer 40 during clock periods 12–22, under the control of counter 35.

Lastly, the multiplexer output and clock signal CLK 2 are applied to grand parity generator 30, which embodies single exclusive OR and delay elements. The output of the grand parity generator 30 is an overall parity check bit, provided at the multiplexer output during clock period 23, which enables the decoder to detect four errors in the 24-bit block.

The (23, 12) Golay code is implemented due to its considerable coding gain, 1dB or more in excess of the hard-decision decoder. The overall parity check bit is added to the (23, 12) code for simple clock conversion and additional coding gain.

Figure 2:
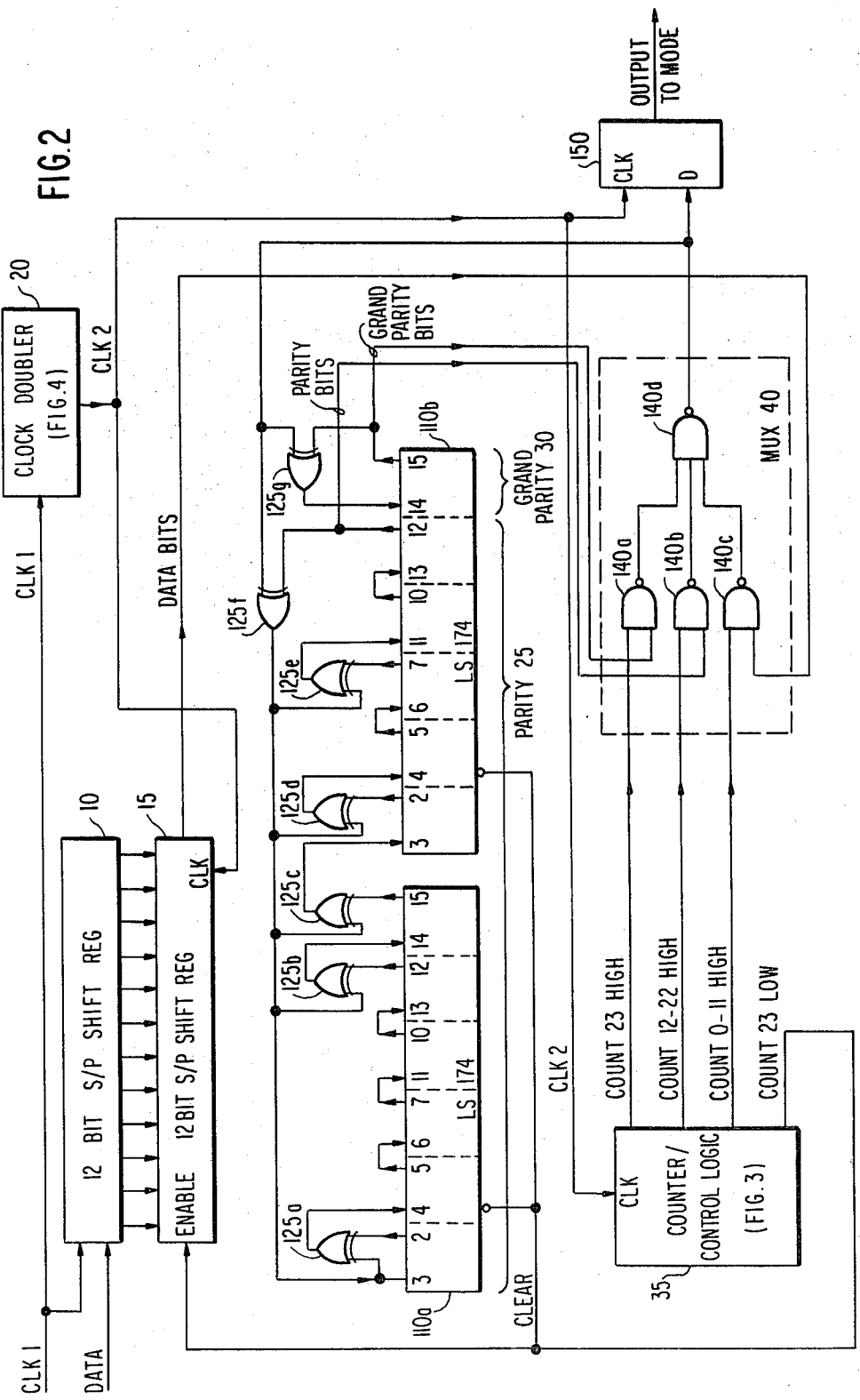
FIG. 2 is a schematic illustration of the details of the encoder in accordance with the present invention.

The schematic illustration in FIG. 2 shows in more detail the circuitry employed in the encoder in accordance with the present invention. As shown, information data is applied to a 12-bit serial-to-parallel shift register 10 at the one-half clock rate CLK 1. At the appropriate time, as determined in counter/control logic 35, the 12 information bits are strobed into a 12-bit parallel-to-serial shift register 15 and subsequently shifted out in a serial manner to multiplexer 40 at clock rate CLK 2, CLK 2 being twice the rate of CLK 1 and being provided by clock doubler 20. The information data bits propagate through NAND gates 140c and 140d during counts 0–11, gate 140c being provided with a high input signal from counter/control logic 35 during counts 0–11.

The output of multiplexer 40 is applied on one hand to an output latch 150, and on the other hand to parity and grand parity generators 25 and 30, respectively, which embody a pair of hex D-type flip-flops with clear, such as the LS 174, and the associated exclusive OR feedback paths to provide the (23, 12) Golay code generator polynomial. In particular, the incoming and outgoing contents of the first flip-flop (pins 3, 2) are XOR'd in gate 125a and applied to the second flip-flop, at pin 4. At the next clock pulse, the contents of the second flip-flop are delivered from pin 5 to the third flip-flop, at pin 6. During the next clock pulse, the data is shifted from the third to the fourth flip-flop (pin 7 to pin 11) and at the next clock pulse from the fourth to fifth flip-flop (pin 10 to pin 13). At the next clock pulse, the contents of flip-flop 5 are XOR'd with the output of XOR gate 125f, and applied to the sixth flip-flop at pin 14. The contents of this sixth flip-flop are XOR'd with the output of gate 125f in XOR gate 125c and applied to the seventh flip-flop (corresponding to the first flip-flop in the second LS 174) at pin 3. The contents of flip-flop 7 are XOR'd with the output of gate 125f in XOR gate 125d and applied to flip-flop 8 at pin 4. The contents of flip-flop 8 are shifted into flip-flop 9 during the next clock pulse, the contents of flip-flop 9 being XOR'd with the output of gate 125f in XOR gate 125e and applied to flip-flop 10 at pin 11. The contents of flip-flop 10 are shifted into flip-flop 11 during the next clock pulse, and are available as an output from flip-flop 11 (pin 12) at the next clock pulse. The output of flip-flop 11 is applied on the one hand to the first input of XOR gate 125f, and on the other hand to NAND gate 140b in multiplexer 40. The output of multiplexer 40 is applied to the second input of XOR gate 125f, the output of gate 125f being applied to one of the inputs of each of the XOR gates 125a through 125e, and to the input of the first flip-flop (pin 3) of the linear feedback shift register as well, to thereby produce the generator polynomial (parity bits at the output of the eleventh shift register, pin 12) as shown.

The parity bits are applied to a first input of NAND gate 140b in multiplexer 40, the second input of gate 140b receiving a high level during clock periods 12–22 from counter/control logic 35, to thereby provide the parity bits as the multiplexer output during counts 12–22. Upon the twenty-third clock count, hex flip-flops 110a and 110b are cleared by a low-going pulse from counter/control logic 35 applied to pin 1 of registers 110a and 110b.

The grand parity generator 30 is embodied in a single flip-flop in hex flip-flop 110b. The data input to the grand parity flip-flop (pin 14) is taken from the output of XOR gate 125g, the latter of which receives input signals from the multiplexer output and the output of the grand parity generator, pin 15, pin 15 also providing the third input at NAND gate 140a of multiplexer 40, gate 140a receiving a second input from counter/control logic 35. Logic 35 provides a high output to gate 140a during clock period 23 to thereby provide the grand parity bit to the encoder output. The encoder output is taken from D-type flip-flop 150 which receives a data input from NAND gate 140d and clock signal CLK 2.

It can be seen that the 12 information bits are shifted out of shift register 15 at twice the input rate to shift register 10, to thereby provide the first 12-bits of the 24-bit block during clock periods 0 through 11. Eleven parity bits corresponding to the (23, 12) Golay code polynomial follow the information bits during the next 11 clock pulses corresponding to clock periods 12–22. Lastly, the grand parity bit completes the 24-bit block at clock period 23.

The details of the counter/control logic 35 of FIG. 2 are shown in greater detail in FIG. 3. JK flip-flops 210a through 210e provide a 5-bit count to NAND gates 225c and 225b to produce the signals required to control multiplexer 40. Flip-flops 210a through 210e are dual J-K positive edge triggered flip-flops with preset and clear, such as the LS 109. Clock signal CLK 2 is provided to the clock inputs of each of the flip-flops 210a through 210e, and a high level (Vcc) is applied to the preset input of each of the flip-flops. Flip-flop 210a receives its J input from Vcc, and its K (hereinafter K) input from ground. Flip-flop 210b receives its J and K inputs from the Q and Q outputs of flip-flop 210a, respectively, AND gate 215a receives inputs from the Q outputs of flip-flops 210a and 210b to provide the J input to flip-flop 210c. Inverter 220a inverts the output of AND gate 215a to provide the K input to flip-flop 210c. The output of AND gate 215a is combined with the Q output of flip-flop 210c at AND gate 215b to provide the J input to flip-flop 210d. The output of AND gate 215b is inverted to provide the K input to flip-flop 210d. The output of AND gate 215b is combined with the Q output from flip-flop 210b in AND gate 215c to provide the J input to flip-flop 210e. The output of AND gate 215c is inverted in inverter 220c to provide the K input to flip-flop 210e. The Q output of flip-flop 210d is combined with the Q output from flip-flop 210e in NAND gate 225a to provide a CLEAR pulse to flip-flops 210a –210e through AND gate 215d, which receives a second input providing an initial RESET pulse to the flip-flops, such that the counter can be initially synchronized to an incoming burst of data.

The control pulses for multiplexer 40 are provided by NAND gates 225b and 225c. The five inputs to NAND gate 225c are the Q output of flip-flop 210a, Q output of 210b, Q from 210c, Q from 210d, and Q from 210e. The five inputs to NAND gate 225b are then Q output from flip-flop 210a, Q from 210b, Q from 210c, Q from 210d, and Q from 210e. The output of NAND gate 225c is applied to the SET input of flip-flop 230a. The output of NAND gate 225b is applied to the clear input of flip-flop 230a, a first input of AND gate 215e, inverter 220d, and the clock input of flip-flop 230b. The Q output of flip-flop 230a attains a high level for clock periods 12–22, and is applied to NAND gate 140b in multiplexer 40. The Q output of flip-flop 230a is applied to a second input of AND gate 215e to provide a high level on the output of gate 215e for clock periods 0–11 to NAND gate 140c in multiplexer 40. The output of NAND gate 225b and the Q output of flip-flop 230a may alternatively be applied in common to a three input NAND gate 140c to provide an equivalent function. The output of inverter 220d provides a high level at clock period 23 to NAND gate 140a. A low level pulse shortly after clock period 23 is required to enable the input of data in to shift register 15, to clear the parity generators 25 and 30, and is provided at the output of inverter 220e, the output of which is applied to the clear input of flip-flop 230b. The SET and delay inputs of flip-flop 230b are applied to the control voltage Vcc, and the Q output of flip-flop 230b is applied to the input of inverter 220e.

The details of clock doubler 20 of FIG. 2 are illustrated in FIG. 4. The one-half rate clock signal CLK 1 is applied on the one hand to the input of inverter 315a, and on the other hand to a first input of NAND gate 320b. The output of inverter 315a is applied to a first input of NAND gate 320a, and to a first input of XOR gate 310a, which in turn provides an output to a first input to XOR gate 310b, which in turn provides an output to a first input of XOR gate 310c, which in turn provides an output to a first input of XOR gate 310d. The second inputs of XOR gates 310a through 310d receive the control voltage Vcc. The output of XOR gate 310d is applied on the one hand to the second input of NAND gate 320b and on the other hand to the input of inverter 315b. The output of inverter 315b is applied to the second input of NAND gate 320a. The output of NAND gates 320a and 320b are applied to the inputs of NAND gate 320c to provide clock signal CLK 2 at twice the rate of CLK 1.

In the arrangement shown in FIG. 4, clock signal CLK 2 has a positive half cycle of about 60 nsec, irrespective of the data rate, while the duration of its negative half cycle depends on the rate of CLK 1.

The decoder in accordance with the present invention is illustrated in FIG. 5. The decoder can be divided into substantially identical primary and secondary portions, the major difference therebetween being the data applied to the respective decoders. By way of background, and with respect to FIGS. 6a and 6b, a "soft" decision (namely, whether a received data bit is a one or zero) is made on received data in soft decision detector 390 in accordance with the arrangement shown in FIG. 6a, as opposed to a "hard" decision, wherein a bit residing anywhere above 0 volts is taken to be a 1, regardless of how close to zero it may be. The "soft" decision ranks the bit probability depending upon how positive or negative the incoming data is. For example, a received bit having a voltage value between −1.0 and −0.5 volts, is deemed a "0" with a high probability, and it is thus assigned the bit pattern "00". However, a received bit having a voltage level between −0.5 and 0 volts has a lower probability of being a "0" bit, and it is therefore assigned the pattern of "01". Similar assignments for positive regions C and D are shown and utilized in a manner similar to that for negative regions A and B. The voltage levels used herein are only used for illustrative purposes.

In accordance with the present invention, the primary decoder receives the more significant bit of the soft decision, while the secondary decoder receives the lesser significant bit, as illustrated in FIG. 6b. Soft decision detectors such as detector 390 are well known and may comprise a 2-bit A/D converter in the example used herein.

The incoming data bits are applied to input buffer delay devices 405 and 405' at the clock rate CLK 2, which is extracted from the receiver modem. The respective data streams and clock signals are applied to the associated syndrome generators 400 and 400' and grand parity generators 410 and 410'. The syndrome generators 400 and 400' develop the syndrome based on the same generating polynomial employed in the encoder, FIG. 1. A comparison of the parity generator and grand parity generator 25 and 30 of FIG. 1 to the syndrome generator 400 and grand parity generator 410 illustrates the identity between the encoding and decoding devices, the only difference being that the data applied to the generators of FIG. 1 is taken from the multiplexer output, while the data applied to the generators of FIG. 5 is taken from the received data stream.

When a given encoded block of 24-bits is processed through syndrome generator 400 and grand parity generator 410, a "0" result in each of the delay devices in syndrome generator 400 indicates that no errors in the transmission of the data have occurred, while a zero in grand parity generator 410 indicates no errors or an even number of errors. Conversely, the various nonzero states in the delay devices in syndrome generator 400 can be used to detect the existence and locations of any errors in transmission, while a one in grand parity generator indicates an odd number of errors. At the appropriate time the state of each of the delay devices in syndrome generators 400 and 400', and grand parity generators 410 and 410' are loaded into the respective syndrome registers 420 and 420', the grand parity flag 450 and 450'. The syndrome pattern in registers 420 and 420' are then applied to error tables 430 and 430' which comprise read only memories to provide a list decoding of the error patterns. Rather than storing the error locations in coded form, the error tables 430 and 430' store the error pattern directly, and provide the error pattern directly to error registers 440 and 440'. The error tables 430 and 430' also provide an indication of the number of errors detected therein to comparator 445 which, based upon the relative number of errors, chooses the error corrected data from the primary or secondary decoder. Comparator 445 may comprise a 4-bit magnitude comparator such as the LS85. In accordance with the present invention, the primary decoder is chosen unless the secondary decoder detects a lower number of errors, the primary decoder being used in the case of a tie. The output of the comparator thus outputs a low level to inverter 453 and to the first input of NAND gate 460b, the output of inverter 453 being applied to a first input of NAND gate 460a to thereby select the corrected data from the primary decoder, and vice versa when the secondary decoder is chosen. The outputs of NAND gates 460a and 460b are applied to NAND gate 460c, the output of which in turn provides an input to output buffer 465. The output register 470 receives the corrected data from the output buffer under the control of counter/control logic 600 at the appropriate point in time. The data loaded into the output register 470 is clocked out at the clock rate CLK 1 to provide output data.

Assuming that three or fewer errors are detected in error tables 430 and 430', the data from buffer 405 is corrected by combining the 12 information bits with the 12-bit error pattern in exclusive OR gates 455a and 455b, the outputs of which provide the respective second inputs to NAND gates 460a and 460b. However, since the (24,12) Golay code can only correct up to three errors, the presence of four errors must be detected, and in the event thereof, correction of the data must be avoided. Thus, triple-errors detected at the output of error tables 430 and 430', in combination with an even error number indication from grand parity generator 410 in grand parity flags 450 and 450' is indicative of four or more errors. The triple-error indication and the even grand parity error indication are combined in NAND gates 451 and 451', the outputs of which are respectively connected to a first input of AND gates 452 and 452'. The second inputs of AND gates 452 and 452' receive the 12-bit error pattern, to thereby inhibit application of the error pattern to the respective exclusive OR gates in the event of quadruple errors.

The decoder selectively provides error correction whenever three or fewer errors are detected in accordance with Table 1 below.

TABLE 1

| Number of Errors Detected in Syndrome Generator | Number of Errors Detected in Grant Party Generator | Total Error | Correction |
| --- | --- | --- | --- |
| 0 | Even | No Error | Not necessary |
| 0 | Odd | Grand Parity Error | Not necessary |
| 1 | Even | Single Error and Grand Parity Error | Yes |
| 1 | Odd | Single Error | Yes |
| 2 | Even | Double Errors | Yes |
| 2 | Odd | Double Errors and Grand Parity Error | Yes |
| 3 | Even | Case 1: Triple Errors and Grand Parity Error | |
| 3 | Odd | Case 2: Quadruple Errors | No |
| 3 | Odd | Triple Errors | Yes |

Correction is not necessary where no errors occur to where the only error detected is a grand parity error since the grand parity bit is not a portion of the information bits. However, the error pattern, which consists of all zeros in this case, passes through AND gates 452 and 452' as if correction were taking place.

Because of the advances in integrated circuit technology, it is economically more attractive to store the one-to-one correspondence between the most likely error patterns and syndromes in the error tables 430 and 430' rather than going through the algebraic manipulation on a real time basis.

For high rate codes, it is often necessary to code the location of errors in binary form to minimize the amount of storage required in the list decoder. For example, a t-error correcting (n,k) code has $2^{n-k}$ distinct syndromes. For each bit error, m bits are used to express the locations of the error, where $\log_2 n \leq m \leq \log_2 n+1$. For each error pattern, up to mt bits are required to describe it, and the total amount of storage required for the list decoder is $mt2^{-k}$ bits. However, since the (23, 12) Golay code is a short but powerful code, the common practice of storing error locations in coded form is not economical. If the error pattern is stored directly, only 12-bits are required for each syndrome, since only errors occurring in the 12-bit information portion are of concern, while 15-bits would be required if error locations are coded. Still further, while the m bit counters are usually required to convert the coded locations in the error correction circuitry, the technique in accordance with the present invention requires no such conversion.

The present invention encodes and decodes the first 23 bits as a (23, 12) Golay code and handles the overall parity check bit separately, since separate handling of the grand parity check bit represents no problem in hardwired logic, whereas the error tables 430 and 430' need only be half the size of that for a (24, 12) Golay code, thereby reducing the overall hardware complexity while obtaining the same results.

The primary decoder is shown in more detail in the schematic illustration of FIG. 7. Again, the secondary decoder is substantially identical to the primary decoder, the only difference being the data which is applied thereto. The incoming data stream representing the more significant bit from soft decision detector 390, FIG. 5, is applied on the one hand to shift register delay line 405 and on the other hand to exclusive OR logic 525 in syndrome generator 400. The exclusive OR logic 525 is identical to that illustrated in FIG. 2, and comprises seven exclusive OR gates arranged in a manner identical to that shown for gates 125a-125g, FIG. 2, the only exception being that the input to the first two gates corresponding to gates 125f and 125g is taken from the input data stream, as illustrated in FIG. 5, rather than from the output of the encoder multiplexer 40, illustrated in FIG. 2. Further, the exclusive OR logic 525 is combined with hex flip-flops 510a and 510b in a manner identical to that illustrated in FIG. 2. Thus, the syndrome generator generates the polynomial $$g(x)=1+x+x^5+x^6+x^7+x^9+x^{11}.$$

After 22 periods of clock signals CLK 2, corresponding to the generated 11-bit syndrome, syndrome register 400 is enabled under the control of counter/control logic 600. The syndrome register 400 may comprise an adequate number of data latches such as three LS 75 quad data latches 515a–515c as shown. The first 4-bits of the 11-bit syndrome are derived from pins 2, 5, 7 and 10 of hex flip-flops 510a, and are applied to data input pins 2, 3, 6 and 7, respectively, of data latch 515a. The second 4-bits of the syndrome, derived from pins 12 and 15 of 510a and pins 2 and 5 from hex flip-flops 510b, are applied to input pins 2, 3, 6 and 7 of the second data latch 515b. The last three syndrome bits derived from pits 7, 10 and 12 of 510b are applied to input pins 2, 3 and 6 of the third data latch 515c. The syndrome register 420 accepts the syndrome in accordance with the ENABLE pulse after a count of 21 (a total of 22 counts including zero).

The grand parity information is made available from pin 15 of hex flip-flop 510b at a clock count of 23, the grand parity bit being applied to D-type flip-flop 450a at count 23 under the control of counter/control logic 600. The parity bit is then made available at the output of a second D-type flip-flop 450b at the next count of six from counter/control logic 600.

The output of syndrome register 420 serves as an address to error table 430. The error table 430 may consist of a read only memory, and in accordance with the preferred embodiment, consists of a pair of Intel 2716 2K×8 bit UV EPROMs, 520a and 520b. Output pins 16, 15, 10 and 9 from latch 515a are applied to address input pins 9, 22, 23 and 1 of both PROMs 520a and 520b. Output pins 16, 15, 10 and 9 from latch 515b are applied to address input pins 2, 3, 4 and 5, respectively, of PROMs 520a and 520b. Lastly, the last 3-bits of the syndrome output from pins 16, 15, and 10 of latch 515c are applied to address input pins 6, 7 and 8, respectively, of PROMs 520a and 520b.

There is a one-to-one correspondence between any particular syndrome and an error pattern in the 12 information bits if the number of the errors is less than or equal to three. With the syndrome used as an address, the error table 430 directly stores the most likely 12-bit error pattern, available at output pins 13, 11, 10, 9 of PROM 520a and 17, 16, 15, 14, 13, 11, 10, 9 of PROM 520b. Each of the error pattern words stores an associated 4-bit word available at pins 17–14 of PROM 520a, indicative of the number of errors detected (0–3) whereby one of the outputs at pins 17–14 achieves a HIGH state to indicate the number of errors. For example, a HIGH output from pin 17 indicates a triple-error, a high output from pin 16 indicates a double error, and so on.

The program listing for both the low order (PROM 520b) and high (PROM 520a) bytes of the error table 430 can be easily derived by one skilled in the art using well-known techniques.

Since the access time of the error table 430 is approximately 450 nsec, which is very long compared to TTL, the error pattern produced by the error table 430 is not made available to error pattern register 440, nor is the grand parity bit made available to flip-flop 45b, until the next count of 6, as determined in counter/control logic 600. Similarly, the shift register delay line 405 provides a total 8-bit delay to account for the processing involved in syndrome generator 400, syndrome register 420, error table 430, error pattern register 440, and grand parity flag 450, such that the 12-bits of information and the associated error pattern and grand parity flag are made available to the processing circuitry of FIG. 5 simultaneously.

Returning to FIG. 5, it is seen that the delayed data from input buffer delays 405 and 405' arrive at the associated XOR gates 455a and 455b concurrently with the error pattern in error pattern registers 440 and 440'. Based on the number of errors in the primary and secondary decoders, as taken from pins 17–14 of PROM 520a in each of the decoders, comparator 445 provides either a high or low level to enable one of the primary and second decoders. Further, the pin 17 output from PROM 520a is applied to one input of the associated NAND gates 451 and 451', the other input of the NAND gates receiving the grand parity flag. In the event pin 17 is high and the grand parity flag indicates an even number of errors by providing a high Q output at flip-flop 450b indicative of a total of at least four errors, error correction is disabled by AND gates 452 and 452', and the delayed data passes through one of XOR gates 455a or 455b without being corrected.

The details of counter/control logic 600 are shown in FIG. 8. A modulo-24 counter 610, identical to that illustrated in FIG. 3, is provided in the counter/control logic 600. The 5-bit output, as well as the inverse state outputs, are illustrated, $2^4$ corresponding to the most significant bit, $2^0$ corresponding to the least significant bit. Thus, NAND gate 625a provides a low level at count 6, NAND gate 625b provides a low output for one CLK 2 clock period at count 18, NAND gate 625c provides a low output of count 21, and NAND gate 625c provides a low output at count 23. The low output at count 6 from NAND gate 625a is applied to the LOAD input of error pattern register 440, FIG. 7. The low going output from gate 625a is inverted in inverter 620e to provide a high output at count 6 to the clock input of D-type flip-flop 450b. Thus, the error pattern and grand parity flag are made available to the processing circuitry in FIG. 5 at the appropriate times.

Returning to FIG. 5, the error corrected data is applied to the output buffer 465 at the rate of the clock CLK 2. The twelve error corrected information bits are available in parallel from the buffer 465 to the output register 470 at clock count 18 (6+12). Thus, the low output of NAND gate 625b at count 18 is applied to the control input of output register 470. The error corrected data is subsequently clocked out at a clock rate CLK 1.

Returning to FIG. 8, the low going output of NAND gate 625c at count 21 is applied to the CLOCK input of flip-flop 630a, to produce a high Q output, which in turn is applied to inverter 620f, the output of the inverter being applied to the CLEAR input of the flip-flop, to thereby provide a low pulse after count 21. The low pulse enables the syndrome register to receive the syndrome from syndrome generator 400 at the appropriate time. The low output of NAND gate 625b is inverted in inverter 620d and applied to the first flip-flop 450a in the grand parity flag 450. The output of inverter 620d is also applied to the CLOCK input of flip-flop 630b to thereby provide a high going output at count 23. The high Q output is applied to inverter 620g, the output of the inverter being reapplied to the CLEAR input of flip-flop 630b. Thus, the output of inverter 620g provides a low pulse after count 23 in order to clear the syndrome and grand parity generators.

In view of the foregoing, it will be evident to one skilled in the art that many modifications can be made to the codec in accordance with the present invention. For example, the syndrome register, error table, and error register could be multiplexed and shared in common by both the primary and secondary decoders if desired. However, these elements are not shared in accordance with the preferred embodiment due to the slow access time of the read only memory, and since the savings in complexity may be offset by the requisite control logic.

The implementation of the codec in accordance with the present invention involves TTL 74 LS series logic as the basic building blocks. The input data rate can be variable and in the range of up to about 4 Mbits/s. Since the (24, 12) Golay code is a rate ½ code, the circuit operates at a clock rate twice that of the data rate. Higher speed can be achieved if some of the 74LS series integrated circuits are replaced by the 74S or 74F series, at the expense of higher power consumption.

Various changes, additions and omissions of elements may be made within the spirit and scope of the present invention. It is to be understood that the invention is not limited to the specific details in examples described herein.

What is claimed:

1. An error correcting decoder for receiving a plurality of data bits, at least a portion of said data bits being generated in accordance with a predetermined function, said data bits including information bits and coding bits, said decoder comprising:
generator means for processing said data bits in accordance with said predetermined function to produce a generator output;
memory means receiving said generator output for producing an error pattern in response thereto, said error pattern providing a direct indication of which of said information bis are incorrect; and
correction means for correcting said information bits in accordance with said error pattern.

2. The decoder of claim 1 wherein said correction means comprises logic means having first and second logic inputs, said logic means providing an exclusive OR function, at least a portion of said data bits being applied to said first logic input, said error pattern being applied to said second logic input.

3. The decoder of claim 2 wherein said generator means comprises a syndrome generator for providing a generator output according to the polynomial $$g(x) = 1 + x + x^5 + x^6 + x^7 + x^9 + x^{11}$$

for the (23, 12) Golay code, whereby said correction means can correct as many as three errors.

4. The decoder of claim 3 wherein said memory means further produces an error indication indicative of the number of errors detected up to as many as three errors.

5. The decoder of claim 4 wherein said generator means further comprises an overall parity generator for generating a parity bit based on said plurality of data bits to thereby enable said decoder to detect as many as four errors.

6. The decoder of claim 5 further comprising means for disabling said correction means upon detecting at least four errors.

7. The decoder of any one of claims 1-6 wherein said memory means comprises:
read only memory (ROM) means having an address input and data output, said generator output being applied to said address input, and said data output directly providing said error pattern.

8. The decoder of any one of claims 1-3 wherein said memory means directly stores said error patterns and the number of said errors associated with each of said error patterns.

9. The decoder of claim 8 wherein said memory means comprises a read only memory (ROM), each of said error patterns and said number of errors associated with each of said error patterns being stored as a single word in said ROM, said ROM having an address input receiving said generator output.

10. An error correcting system for receiving a plurality of data bits, at least a portion of said data bits being generated in accordance with a predetermined function, said data bits including information bits and coding bits, said system comprising:
decision means for receiving said data bits and for concurrently providing at least first and second decision outputs in accordance with said data bits;
at least first and second decoders receiving said first and second decision outputs, respectively, and concurrently providing first and second decoded outputs, respectively, said first and second decoders detecting the number of errors in said first and second decision outputs, respectively; and
selector means for selecting, for further processing in processing means, one of said first and second decoded outputs associated with the decision output having the fewer number of detected errors.

11. The error correcting system of claim 10 wherein said decision means ranks said data bits into at least three categories by providing decision bits, at least two of said decision bits thereby identifying each of said data bits as belonging to any one of said at least three categories, the more significant decision bits providing said first decision output, the lesser significant decision bits providing said second decision output.

12. The error correction system of claim 11 wherein said selector means selects said first decoded output for further processing whenever said number of detected errors for said first and second decision outputs are equal.

13. The error correction system of claim 12 wherein said first and second decoders comprises:
generator means for processing said respective first and second decision outputs in accordance with said predetermined function to produce first and second generator outputs, respectively;
memory means receiving said first and second generator output for producing first and second error patterns, respectively, said first and second error patterns providing direct indications of which bits of said first and second decision outputs are incorrect; and
correction means for correcting said first and second decision outputs in accordance with said first and second error patterns, respectively, to provide said first and second decoded outputs, respectively.

14. The error correction system of claim 13 wherein said processing means comprises data output means receiving one of said first and second decoded outputs selected by said selector means, to provide an error corrected output.

15. An error correcting decoder for receiving a plurality of data bits, at least a portion of said data bits being generated in accordance with a predetermined function, said data bits including information bits and coding bits, said decoder comprising generator means for processing said data bits in accordance with said predetermined function to produce a generator output;

memory means receiving said generator output for producing an error pattern in response thereto, said error pattern providing a direct indication of which of said information bits are incorrect;

correction means for correcting said information bits in accordance with said error pattern; and means for disabling said correction means in response to an excessive number of errors in said plurality of data bits.

16. The decoder according to claim 15, wherein said memory means provides an error count output representing the number of errors indicated by said error pattern, said generator means further comprising an overall parity generator for generating a parity bit based on said plurality of data bits, and wherein said means for disabling is responsive to both said parity bit and said error count output for disabling said correction means when the total number of errors indicated by said error count output and said parity bit exceeds said predetermined number.

* * * * *

UNITED STATES PATENT AND TRADEMARK OFFICE
CERTIFICATE OF CORRECTION

PATENT NO. : 4,397,022

DATED : August 2, 1983

INVENTOR(S) : Ming-I Weng et al

It is certified that error appears in the above-identified patent and that said Letters Patent is hereby corrected as shown below:

Column 6, line 64 "the" should be --and--.

Column 8, line 15, "to" should be --or--.

Signed and Sealed this

Twenty-seventh Day of March 1984

[SEAL]

Attest:

GERALD J. MOSSINGHOFF

Attesting Officer       Commissioner of Patents and Trademarks